US008916473B2

(12) United States Patent
Henry et al.

(10) Patent No.: US 8,916,473 B2
(45) Date of Patent: Dec. 23, 2014

(54) METHOD FOR FORMING THROUGH-BASE WAFER VIAS FOR FABRICATION OF STACKED DEVICES

(75) Inventors: James Matthew Henry, Mesa, AZ (US); Daniel Hernandez Castillo, II, Laveen, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 10 days.

(21) Appl. No.: 12/959,452

(22) Filed: Dec. 3, 2010

(65) Prior Publication Data

US 2011/0300710 A1 Dec. 8, 2011

Related U.S. Application Data

(60) Provisional application No. 61/286,099, filed on Dec. 14, 2009.

(51) Int. Cl.
| | |
|---|---|
| H01L 21/306 | (2006.01) |
| H01L 21/768 | (2006.01) |
| H01L 23/14 | (2006.01) |
| H01L 21/683 | (2006.01) |
| H01L 21/48 | (2006.01) |
| C09G 1/02 | (2006.01) |
| H01L 25/065 | (2006.01) |

(52) U.S. Cl.
CPC ..... *H01L 23/147* (2013.01); *H01L 2221/68327* (2013.01); *H01L 21/76898* (2013.01); *H01L 2924/10253* (2013.01); *H01L 2221/6834* (2013.01); *H01L 21/6835* (2013.01); *H01L 21/486* (2013.01); *H01L 21/30625* (2013.01); *H01L 25/0657* (2013.01); *H01L 2225/06541* (2013.01); *C09G 1/02* (2013.01); *H01L 2924/0002* (2013.01); *H10L 21/3212* (2013.01)
USPC ...................... 438/693; 438/667; 257/E21.23

(58) Field of Classification Search
CPC ............................ C09G 1/02; H01L 21/30625
USPC ............................................. 438/693; 216/88
See application file for complete search history.

(56) References Cited

U.S. PATENT DOCUMENTS

| | | | |
|---|---|---|---|
| 5,792,709 A | 8/1998 | Robinson et al. | |
| 6,083,838 A | 7/2000 | Burton et al. | |
| 6,117,783 A | 9/2000 | Small et al. | |
| 6,313,039 B1 | 11/2001 | Small et al. | |
| 6,527,622 B1 | 3/2003 | Brusic et al. | |
| 6,635,186 B1 | 10/2003 | Small et al. | |
| 6,720,264 B2 | 4/2004 | Sahota et al. | |
| 6,852,632 B2 | 2/2005 | Wang et al. | |
| 6,855,266 B1 | 2/2005 | Wang et al. | |
| 6,866,792 B2 | 3/2005 | Small et al. | |
| 6,867,140 B2 | 3/2005 | Wang et al. | |
| 6,869,336 B1 | 3/2005 | Hardikar et al. | |
| 6,936,543 B2 | 8/2005 | Schroeder et al. | |
| 6,974,777 B2 | 12/2005 | Moeggenborg et al. | |
| 7,005,382 B2 | 2/2006 | Nishimoto et al. | |
| 7,014,770 B2 | 3/2006 | Umezawa et al. | |
| 7,033,942 B2 | 4/2006 | Small et al. | |
| 7,040,958 B2 | 5/2006 | Gan et al. | |
| 7,153,335 B2 | 12/2006 | Siddiqui et al. | |
| 7,247,566 B2 | 7/2007 | Carter et al. | |
| 7,276,180 B2 | 10/2007 | Small et al. | |
| 2002/0096659 A1* | 7/2002 | Sakai et al. | 252/79 |
| 2003/0162399 A1 | 8/2003 | Singh | |
| 2003/0194879 A1 | 10/2003 | Small et al. | |
| 2004/0012795 A1* | 1/2004 | Moore | 356/630 |
| 2004/0150096 A1 | 8/2004 | Purushothaman et al. | |
| 2005/0070109 A1 | 3/2005 | Feller et al. | |
| 2005/0090104 A1 | 4/2005 | Yang et al. | |
| 2005/0178742 A1 | 8/2005 | Chelle et al. | |
| 2005/0258139 A1 | 11/2005 | Nojo et al. | |
| 2006/0037942 A1 | 2/2006 | Yun et al. | |
| 2006/0108666 A1 | 5/2006 | Koizumi | |
| 2007/0075042 A1* | 4/2007 | Siddiqui et al. | 216/89 |
| 2007/0190692 A1* | 8/2007 | Erturk et al. | 438/118 |
| 2007/0251156 A1 | 11/2007 | Siddiqui | |
| 2008/0038995 A1 | 2/2008 | Small et al. | |
| 2009/0001339 A1 | 1/2009 | Lee et al. | |
| 2009/0042390 A1* | 2/2009 | Koyata et al. | 438/691 |
| 2009/0283871 A1 | 11/2009 | Chang et al. | |
| 2010/0130101 A1* | 5/2010 | Wang et al. | 451/8 |

FOREIGN PATENT DOCUMENTS

| | | | | |
|---|---|---|---|---|
| JP | 2000117635 A | * | 4/2000 | B24B 57/02 |
| KR | 10-2009-0002501 | | 1/2009 | |

OTHER PUBLICATIONS

Gregory B. Shinn et al, Chemical-Mechanical Polish, Handbook of Semiconductor Mfg. Tech., 2000, pp. 415-460.
D. Zeidler et al, Characterization of Cu Chemical Mechanical Polishing by Electrochemical Investigations, Micro. Engrg. 33, 1997, pp. 259-265.
Ronald J. Gutmann et al, Chemical-Mechanical Polishing of Copper With Oxide and Polymer Interlevel Dielectrics, Thin Solid Films 270 (1995) pp. 596-600.
Koen De Munck et al, Grinding and Mixed Silicon Copper CMP of Stacked Patterned Wafers for 3D Integration, Mater. Res. Soc. Symp. Proc. vol. 970, 2007.

(Continued)

*Primary Examiner* — Duy Deo
*Assistant Examiner* — Mahmoud Dahimene
(74) *Attorney, Agent, or Firm* — Lina Yang

(57) ABSTRACT

An effective chemical mechanical planarization (CMP) method is provided for forming vias in silicon wafers for the fabrication of stacked devices using TSV (through-silicon via) technology. The method affords high removal rates of both metal (e.g., copper) and silicon such that a need for a grinding step prior to CMP processing may not be necessary. The method affords an approximately 1:1 Cu:Si selectivity for removal of silicon and copper under appropriate conditions and the Cu:Si selectivity is tunable by adjustment of levels of some key components.

13 Claims, No Drawings

(56) References Cited

OTHER PUBLICATIONS

Brian L. Mueller et al, Polishing Surfaces for Integrated Circuits, Chemtech, Feb. 1998, pp. 38-46.

Howard Landis et al, Integration of Chemical-Mechanical Polishing Into CMOS Integrated Circuit Manufacturing, Thin Solid Films, 220, 1992, pp. 1-7.

K.S. Kumar et al, Chemical-Mechanical Polishing of Copper in Glycerol Based Slurries, Mat. Res. Soc. Symp. Proc., vol. 427, 1996, pp. 237-242.

Q. Luo et al, Stabilization of Alumina Slurry for Chemical-Mechanical Polishing of Copper, Langmuir, 1996, vol. 12, No. 15, pp. 3563-3566.

Ronald Carpio et al, Initial Study on Copper CMP Slurry Chemistries, Thin Solid Films, 266, 1995, pp. 238-244.

\* cited by examiner

METHOD FOR FORMING THROUGH-BASE WAFER VIAS FOR FABRICATION OF STACKED DEVICES

CROSS REFERENCE TO RELATED APPLICATION

The present patent application claims the benefit of U.S. Provisional Patent Application Ser. No. 61/286,099 filed Dec. 14, 2009.

FIELD OF THE INVENTION

This invention is in the field of through-base wafer technology for thinning the backsides of work base wafers prior to the integrated circuit chips replicated across the wafer having the chip's assembly into stacked devices. A specific example of through-base wafer technology is where the base wafer(s) is a silicon wafer, in which case this technology is termed through-silicon via (TSV) technology.

The invention relates to improved methods for effecting through-base wafer technology that utilizes chemical mechanical planarization (CMP) with high removal rates for removal of base wafer material (e.g., silicon).

BACKGROUND OF THE INVENTION

Three dimensional (3D) integration promises to reduce system form factor through direct stacking and interconnection of chips, made using different technologies, into a single system. These interconnects consist of small and deep through-wafer vias in the form of metal (e.g., copper) nails. Vias are generally vertical electrical connectors that electrically connect different generally horizontal levels of circuitry, and in the case of the present invention, electrically connect electrical circuits on distinct integrated circuit chips. One of the enabling technologies to achieve 3D stacks, is thinning of the base wafer on which the semiconductor circuits (integrated circuits) are disposed. Semiconductor wafer manufacturing typically involves hundreds of discrete operations on the surface of a silicon wafer, which are performed over a number of weeks. In order to minimize wafer breakage and damage, which can easily occur during this lengthy manufacturing process, the base wafers are typically 300- to 800-microns thick. The base wafer is thinned by removing base wafer material (e.g., silicon in case of silicon wafer processing) from the backside of the wafer. This can involve gluing the front side of a wafer comprising an integrated circuit thereon to a carrier wafer, and then grinding, and then CMP of the backside of the wafer to achieve a thickness of about 10 to 50 microns, while the wafer is temporarily glued to a carrier. This thinning exposes conductive vias extending at least partially through (e.g., completely through) the base wafer.

The grinding step has been considered necessary because CMP processes, especially for silicon, have historically been very limited in rate. However, wafer delamination and destruction, as well as destruction of the grinding wheels, has been an unfortunate, but not uncommon, problem with grinding of the backside of a silicon wafer. This is particularly problematic, because the wafer represents the end-product of a number of elaborate fabrication and quality control steps, and failures of these wafers, therefore, represent significant economic loss. Further, destruction of grinding wheels results in considerable line down time, as well as resulting in additional economic loss.

What is needed is a CMP process capable of polishing base wafer material (e.g., silicon in case of a silicon wafer) at a sufficiently high rate so that the grinding step can be eliminated. Even in processes where back-side material is ground in a grinding step, the use of high removal rate CMP can allow manufacturers to specify less material that needs to be ground from the backside of wafers.

Chemical mechanical planarization (chemical mechanical polishing, CMP) for planarization of semiconductor substrates is now widely known to those skilled in the art and has been described in numerous patents and open literature publications. Some introductory references on CMP are as follows: "Polishing Surfaces for Integrated Circuits", by B. L. Mueller and J. S. Steckenrider, Chemtech, February, 1998, pages 38-46; H. Landis et al., Thin Solids Films, 220 (1992), page 1; and "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated, while a wafer carrier system or polishing head applies pressure (downward force) against the substrate. The slurry accomplishes the planarization (polishing) process by chemically and mechanically interacting with the substrate film being planarized, due to the effect of the downward force and the rotational movement of the pad relative to the substrate. Polishing is continued in this manner until the desired film on the substrate is removed, with the usual objective being to effectively planarize the substrate. Typically metal CMP slurries contain an abrasive material, such as silica or alumina, suspended in an oxidizing, aqueous medium.

Silicon based semiconductor devices, such as integrated circuits (ICs), also known as integrated circuit chips, typically include a dielectric layer, metal line circuits, transistor switches forming memory and computational features, as well as capacitors and additional integrated circuit electrical devices making up a complete, operational electrical processing or memory device. Multilevel circuit traces, typically formed from aluminum or an aluminum alloy or copper, are patterned onto the dielectric layer substrate. There are numerous types of layers that can be polished by CMP, for example, silicon nitride, interlayer dielectrics (ILD) such as silicon oxide and low-k films, including carbon-doped oxides; metal layers, such as tungsten, copper, aluminum, etc., which are used to connect the active devices; barrier layer materials such as titanium, titanium nitride, tantalum, tantalum nitride, noble metals, etc.

BRIEF SUMMARY OF THE INVENTION

In one embodiment, the invention is a method for preparing a base silicon wafer for constructing an assembly comprising at least two integrated circuit chips at least one of which is from the base silicon wafer, said method comprising:
  a) providing the base silicon wafer having front and back sides, wherein the front side comprises integrated circuits disposed thereon and wherein the base wafer comprises at least one conductive via comprising conductive metal and extending from the front of the base silicon wafer at least partially through the base silicon wafer;
  b) affixing the front side of the base silicon wafer having integrated circuits thereon to a carrier;

c) contacting the back side of the base silicon wafer with a polishing pad and a first CMP slurry, said first CMP slurry comprising:
   1) a liquid carrier;
   2) hydrogen peroxide at a level of 0.02 weight percent to less than 0.50 weight percent; and
   3) an abrasive; and
d) polishing the backside of the base silicon wafer until at least one conductive via is exposed or further exposed, wherein silicon on the base silicon wafer is polished using the first CMP slurry at a removal rate of at least 5,000 angstroms per minute at 6 psi or less of downforce.

In another embodiment, the invention is a method for preparing a base silicon wafer for constructing an assembly comprising at least two integrated circuit chips at least one of which is from the base silicon wafer, said method comprising:
a) providing the base silicon wafer having front and back sides, wherein the front side comprises integrated circuits disposed thereon and wherein the base wafer comprises at least one conductive via comprising conductive metal and extending from the front of the base silicon wafer at least partially through the base silicon wafer;
b) affixing the front side of the base silicon wafer having integrated circuits thereon to a carrier;
c) contacting the back side of the base silicon wafer with a polishing pad and a first CMP slurry, said first CMP slurry comprising:
   1) a liquid carrier;
   2) hydrogen peroxide at a level of 0.02 weight percent to less than 0.50 weight percent; and
   3) an abrasive which may be suspended in the slurry, which may be affixed to a polishing pad, or both; and
d) polishing the backside of the base silicon wafer until at least one conductive via is exposed or further exposed, wherein silicon on the base silicon wafer is polished using the first CMP slurry at a removal rate of at least 5,000 angstroms per minute at 6 psi or less of downforce.

DETAILED DESCRIPTION OF THE INVENTION

For certain areas of TSV technology applied to silicon wafers containing metalized areas of copper, it is desirable and necessary to have a CMP slurry, that will polish to afford removal of copper and silicon at approximately the same rate. Such a slurry is said to be a 1:1 selective slurry since these two removal rates are approximately the same.

In order for a metal, such as copper, to be removed at a reasonably high rate during CMP processing, the presence of a strong oxidizing agent is generally required. Examples of strong oxidizing agents, that are effective for metal CMP, include; hydrogen peroxide, periodic acid, ammonium persulfate, and potassium permanganate. Hydrogen peroxide is a preferred strong oxidizing agent due to safety and environmental considerations, where innocuous water is produced as a by-product during oxidation with this compound. While hydrogen peroxide is useful for metal removal during CMP processing, it is often not useful and even counterproductive towards removal of silicon during CMP processing, when present at moderate and high levels, as some of the comparative examples below illustrate. For example, when hydrogen peroxide is used in copper CMP, it is typically present at a level of 1 weight percent or higher. When a slurry containing 1 weight percent hydrogen peroxide was used in the present examples to polish a silicon wafer containing copper areas, the presence of hydrogen peroxide resulted in the silicon removal rate being reduced to ineffective levels for thinning for through base wafer technology, where significant silicon removal rates are needed. See Examples 1 and 2.

Surprisingly and unexpectedly, work leading to this invention has established that CMP compositions containing low levels of hydrogen peroxide still afford reasonable removal rates of copper, but also afford approximately the same removal rates of silicon, such that these slurries are or can be tuned to be approximately 1:1 copper:silicon selectivity slurries, that are especially useful in TSV technology. The Cu:Si selectivity can be in the range of 2:1 to 0.5:1, alternatively 1.5:1 to 0.67:1, further alternatively 1.2:1 to 0.8:1.

Another important aspect of this finding is that, as seen in the examples below, the copper removal rate can be tuned by adjusting the oxidizer's concentration, while having only a small effect on the silicon removal rate. This property of the inventive slurry allows users to fine tune their processes, without having to use different formulations of slurry. This slurry is capable of producing exactly a 1:1 selectivity (when suitably tuned) if so desired, or this slurry can be tuned to have slightly higher or lower copper removal rate than silicon. This latter characteristic is important with regard to dishing/protrusion concerns and defects that can occur during CMP processing. If a flat surface of a TSV wafer is desired, and the slurry is producing slight recess of the copper nails, the concentration of peroxide can be slightly reduced to lower the rate enough that recess is no longer an issue. Vice versa, if the nail is protruding from the surface of the TSV wafer, the concentration of the oxidizer can be slightly increased to raise the copper rate enough that the protrusion is now polished flat.

While not being bound by theory, the inventors believe that polishing a silicon-containing substrate with a slurry containing hydrogen peroxide above a certain level (e.g., equal to or greater than 0.5 weight percent) results in the silicon on the surface of the substrate being substantially passivated by atomic (free) hydrogen produced from the hydrogen peroxide in the slurry. The inventors believe that certain strong oxidizing agents, such as hydrogen peroxide, are capable of generating atomic hydrogen and a hydroperoxyl radical. The $sp^2$ hybridized silicon surface has dangling bonds with free radical sites, that can react with atomic hydrogen and other reactive species. Once this reaction occurs, it is essentially irreversible, under ambient conditions, and the silicon surface is effectively passivated.

Surprisingly, the inventors have found that slurries with low levels of hydrogen peroxide (less than 0.5 weight percent) are effective in affording substantial removal rates of both silicon and copper during CMP processing. Again, while not being bound by theory, the inventors believe that the (activation) energy required to start a reaction of hydrogen peroxide with silicon is slightly higher than the energy required to start a reaction of hydrogen peroxide with copper. Using a low level of hydrogen peroxide will limit the amount available to react, and reaction will predominantly occur with copper since this reaction is of lower energy. If, however, with use of higher levels of hydrogen peroxide, where there are substantial amounts of this oxidizing agent present during the reaction, reaction can occur with both silicon and copper surfaces, and consequently silicon on a surface as described in the immediately preceding paragraph is more readily passivated in comparison to that occurring with low levels of hydrogen peroxide present.

As explained supra, this invention is a method for preparing a base silicon wafer for constructing an assembly, containing two or more integrated circuit chips, at least one of which is from the base silicon wafer, that, when the integrated circuit chips are assembled, is a stacked device. A key aspect of this method entails use of chemical mechanical planarization (CMP) to effect planarization of the backsides of base wafer(s), with high removal rates of base wafer material (e.g., silicon). The method entails use of a CMP slurry, comprising:
1) a liquid carrier;
2) hydrogen peroxide at a level of 0.02 weight percent to less than 0.50 weight percent;
3) an abrasive.

The liquid carrier present in the compositions, that are utilized in the methods of this invention, can be any liquid at ambient conditions, that has suitable properties for use in a CMP slurry. Suitable liquid carriers are those that solubilize most or all of the components, apart from the abrasive(s), and which afford relatively stable dispersions of the abrasive(s). Suitable liquid carriers include, but are not limited to, water and mixtures of water and organic compound(s), that are either soluble or dispersible in water. As explained infra, various organic solvents can be employed alone or with water as liquid carrier.

In this invention, low levels of hydrogen peroxide are used as the oxidizing agent in CMP processing of base wafers (e.g., silicon wafers) containing metalized areas (e.g., copper areas). In an embodiment, the level of hydrogen peroxide can range from about 0.02 weight percent to less than 0.5 weight percent. In an embodiment, the level of hydrogen peroxide can range from less than 0.05 weight percent to about 0.4 weight percent. In an embodiment, the level of hydrogen peroxide can range from less than 0.05 weight percent to about 0.3 weight percent. In an embodiment, the level of hydrogen peroxide can range from less than 0.05 weight percent to about 0.25 weight percent. In an embodiment, the level of hydrogen peroxide can range from about 0.15 weight percent to about 0.25 weight percent such as 0.20 weight percent. In an embodiment, the level of hydrogen peroxide can range from about 0.10 weight percent to about 0.20 weight percent, such as 0.15 weight percent. If the level of hydrogen peroxide is equal to or above 0.5 weight percent, the removal rate of silicon during CMP of a silicon wafer is too low for a reasonable CMP processing time. If the level of hydrogen peroxide is below about 0.02 weight percent, the removal rate of copper or other metal is too low for a reasonable CMP processing time.

Both standard (unmodified) abrasives and surface-modified abrasives can be employed in this invention, when applicable. Suitable unmodified abrasives include, but are not limited to, silica, alumina, titania, zirconia, germania, ceria, and co-formed products thereof, and mixtures thereof. A surface-modified abrasive obtained by treatment of an unmodified abrasive (e.g., silica) with an inorganic or organometallic compound can also be employed in this invention. Suitable inorganic compounds for modification, include; boric acid, sodium aluminate, and potassium aluminate. Suitable organometallic compounds for modification, include; aluminum acetate, aluminum formate, and aluminum propionate. Suitable abrasives, include, but are not limited to, colloidal products, fumed products, and mixtures thereof. Some specific examples of surface-modified abrasives are modification of silica with boric acid to give boron surface-modified silica and modification of silica with sodium aluminate or potassium aluminate to give aluminate surface-modified silica.

Silica and surface-modified silica are preferred abrasive materials used in the present invention. The silica may be, for example, colloidal silica, fumed silica and other silica dispersions; however, the preferred silica is colloidal silica or surface-modified colloidal silica.

In most embodiments, the abrasive is present in the slurry in a concentration of about 0.001 weight % to about 30 weight % of the total weight of the slurry. In one embodiment, the abrasive is present in a concentration of about 0.5 weight % to about 20 weight % of the total weight of the slurry. In another embodiment, the abrasive is present in a concentration of about 1 weight % to about 10 weight % of the total weight of the slurry, and, in yet another embodiment, the abrasive is present in a concentration of about 1 weight % to about 5 weight %.

In an embodiment, the inventive slurry contains a chelating agent. Suitable chelating agents include, but are not limited to, an amino acid, ethylenediamine tetraacetic acid, and an alkane amine. Suitable amino acids include, but are not limited to, glycine, alanine, asparagine, aspartic acid, cysteine, glutamic acid, glutamine, proline, serine, tyrosine, arginine, and histidine. In an embodiment, the chelating agent is an amino acid, such as glycine. In a preferred embodiment, glycine is the chelating agent. Suitable alkane amines include, but are not limited to, ethylene diamine and triethylene diamine.

Other chemicals that may be added to the CMP slurry composition include, for example, water-miscible solvents, surfactants, pH adjusting agents, acids, corrosion inhibitors, fluorine-containing compounds, chelating agents, non-polymeric nitrogen-containing compounds, and salts.

Suitable water-miscible solvents that may be added to the slurry composition include, for example, ethyl acetate, methanol, ethanol, propanol, isopropanol, butanol, glycerol, ethylene glycol, and propylene glycol, and mixtures thereof. The water-miscible solvents may be present in the slurry composition in a concentration of about 0 weight % to about 4 weight % in one embodiment, of about 0.1 weight % to about 2 weight % in another embodiment, and, in a concentration of about 0.5 weight % to about 1 weight % in yet another embodiment; each of these weight % values is based on the total weight of the slurry. The preferred types of water-miscible solvents are isopropanol, butanol, and glycerol.

Suitable surfactant compounds that may be added to the slurry composition include, for example, any of the numerous nonionic, anionic, cationic or amphoteric surfactants known to those skilled in the art. The surfactant compounds may be present in the slurry composition in a concentration of about 0 weight % to about 1 weight % in one embodiment, of about 0.0005 weight % to about 1 weight % in another embodiment, and, in a concentration of about 0.001 weight % to about 0.5 weight % in yet another embodiment; each of these weight % values is based on the total weight of the slurry. The preferred types of surfactants are nonionic, anionic, or mixtures thereof and are most preferably present in a concentration of about 10 ppm to about 1000 ppm of the total weight of the slurry. Nonionic surfactants are preferred.

The pH-adjusting agent is used to improve the stability of the polishing composition, to improve the safety in use or to meet the requirements of various regulations. As a pH-adjusting agent to be used to lower the pH of the polishing composition of the present invention, hydrochloric acid, nitric acid, sulfuric acid, chloroacetic acid, tartaric acid, succinic acid, citric acid, malic acid, malonic acid, various fatty acids, various polycarboxylic acids may be employed. On the other hand, as a pH-adjusting agent to be used for the purpose of raising the pH, potassium hydroxide, sodium hydroxide, ammonia, tetramethylammonium hydroxide, ammonium hydroxide, piperazine, polyethyleneimine, etc., may be employed. The polishing composition of the present invention is not particularly limited with respect to the pH, but it is usually adjusted to pH 5 to 12 and, in various embodiments, the pH is adjusted to pH 7 to 12. In one embodiment, a suitable basic slurry pH, for example, is from about 7 to about 11. In another embodiment, a suitable slurry pH is from about 8 to about 10. In another embodiment the pH is between 10.01 and 10.49. In an embodiment, the pH is between 10.5 and 11.5. In another embodiment, the pH is between 11.6 and 13.

Other suitable acid compounds that may be added (in place of or in addition to the pH-adjusting acids mentioned supra) to the slurry composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. These acid compounds may be present in the slurry composition in a concentration of about 0 weight % to about 5 weight % of the total weight of the slurry.

Suitable corrosion inhibitors that may be added to the slurry composition include, for example, 1,2,4-triazole, benzotriazole, 6-tolylytriazole, tolyltriazole derivatives, 1-(2,3-dicarboxypropyl)benzotriazole, and branched-alkylphenol-substituted-benzotriazole compounds. Some useful commercial corrosion inhibitors include; Mafo13MOD1, Iconol TDA-9, and Iconol TDA-6 (all available from BASF Corp., Florham Park, N.J.), and Daetec MI-110 (available from Daetec L.L.C., Camarmillo, Calif.). In an embodiment, the corrosion inhibitor is a phenolic compound, and in another embodiment, the phenolic compound is catechol, present at a level between 0.001% by weight (10 ppm) and 5% by weight. The corrosion inhibitor may be present in the slurry in a concentration of about 0 ppm to about 4000 ppm in an embodiment, from about 10 ppm to about 4000 ppm in another embodiment, from about 50 ppm to about 2000 ppm in another embodiment, and from about 50 ppm to about 500 ppm in yet another embodiment, all based on the total weight of the slurry. In an embodiment, the corrosion inhibitor is present a level between 0.0005% by weight (5 ppm) and 0.1% by weight (1000 ppm).

Carboxylic acids, if added, may also impart corrosion inhibition properties to the slurry composition.

If desired, to increase further the selectivity for removal of certain metals relative to dielectric and/or base wafer material during CMP, fluorine-containing compounds may be added to the slurry composition. Suitable fluorine-containing compounds include, for example, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof. The fluorine-containing compounds may be present in the slurry composition in a concentration of about 0 weight % to about 5 weight % in an embodiment, preferably from about 0.65 weight % to about 5 weight % in another embodiment, from about 0.5 weight % to about 2 weight % in yet another embodiment, all based on the total weight of the slurry. A suitable fluorine-containing compound is ammonium fluoride.

Suitable non-polymeric nitrogen-containing compounds (amines, hydroxides, etc.) that may be added to the slurry composition include, for example, ammonium hydroxide, monoethanolamine, diethanolamine, triethanolamine, diethyleneglycolamine, N-hydroxylethylpiperazine, and mixtures thereof. These non-polymeric nitrogen-containing compounds may be present in the slurry composition in a concentration of about 0 weight % to about 4 weight %, and, if present, are normally present at a level of about 0.01 weight % to about 3 weight % of the total weight of the slurry. A preferred non-polymeric nitrogen-containing compound is monoethanolamine.

Still other chemicals that can be added to the slurry compositions are biological agents, such as; bactericides, biocides and fungicides, especially if the pH is around about 6 to 9. Suitable biocides, include, but are not limited to, 1,2-benzisothiazolin-3-one; 2(hydroxymethyl)amino ethanol; 1,3-dihydroxymethyl-5,5-dimethylhydantoin; 1-hydroxymethyl-5,5-dimethylhydantion; 3-iodo-2-propynyl-butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof. Preferred biocides are isothiazolines and benzisothiazolines. When present, a biocide is usually present in a concentration of about 0.001 weight % to about 0.1 weight % of the total weight of the slurry.

CMP Method

The CMP method utilized in this invention entails use of the aforementioned composition (as disclosed supra) for chemical mechanical planarization of backside of a base wafer (e.g., a silicon wafer) during through-base wafer processing. In an embodiment, the base wafer is a silicon wafer.

A base wafer in this invention has both front and back sides and the front side has integrated circuits disposed thereon. The base wafer comprises at least one conductive via comprising conductive metal and the at least one conductive via extends from the front of the base wafer at least partially through the base wafer. The conductive metal of the at least one conductive via can, in general, be any conductive metal that is a solid at ambient temperature. Conductive metals, such as mercury and various alloys that are not solids (e.g., liquids) under ambient conditions of temperature and pressure, are excluded as possible materials for conductive vias in this invention. Examples of conductive metals are copper, tungsten, and aluminum. In an embodiment, the conductive metal is copper. In another embodiment, the conductive metal is selected from the group consisting of copper and tungsten.

In the method of this invention, the front side of the (first) base wafer is affixed to a carrier. The carrier can be any material that is capable of acting as a suitable support for the base wafer, during subsequent CMP processing (as described below). Suitable carrier materials include, but are not limited to, steel, glass, and various polymers, such as polyethylene, polypropylene, and poly (vinyl chloride).

In an embodiment of the method of this invention, affixing the front side of the base wafer having integrated circuits thereon to the carrier can be done in any manner known in the art. An example is use of a suitable adhesive to temporarily bond the front side of a base wafer to the carrier, while CMP processing and/or grinding is being performed on the back side of the base wafer. Affixing the base wafer to the carrier affords a base wafer/carrier, as a sandwich structure, with the back side of the base wafer being an outer surface.

A grinding step to remove a significant amount of material from the back side of the first base wafer may or may not be performed on the base wafer/carrier, prior to CMP processing to planarize the back side of the base wafer. Any grinding process known in the art can be utilized. In an embodiment, the back side of the base wafer is not subjected to a grinding step, before chemically mechanically polishing the back side of the base wafer. In another embodiment, the back side of the base wafer is subjected to a grinding step, before chemically mechanically polishing the back side of the base wafer Next, following the grinding step, if it is done, according to the method of this invention, the backside of the base wafer/carrier is placed, such that the back side of the base wafer is face-down on a polishing pad, which is fixedly attached to a rotatable platen of a CMP polisher. In this manner, the back side of the base wafer to be polished and planarized is placed in contact with the polishing pad. A wafer carrier system or polishing head is used to hold the base wafer/carrier in place and to apply a downward pressure against the back side of the base wafer/carrier during CMP processing, while the platen and the substrate are rotated. The polishing composition (first CMP slurry) is applied (usually continuously) on the pad, through the pad or between the pad and wafer, during CMP processing to effect the removal of material from the back side of the base wafer (e.g., silicon wafer). According to this invention, the method utilizing the first CMP slurry will polish the first base wafer at a rate of at least 5,000 angstroms per minute at 6 psi or less of down-force.

In an embodiment, the method utilizing the first CMP slurry will polish the first base wafer at a rate of at least 5,000 angstroms per minute at 6 psi or less of down-force. In an embodiment, the method utilizing the first CMP slurry will polish the first base wafer at a rate of at least 9,000 angstroms per minute at 6 psi or less of down-force. In an embodiment, the method utilizing the first CMP slurry will polish the first base wafer at a rate of at least 12,000 angstroms per minute at 6 psi or less of down-force. In an embodiment, the method utilizing the first CMP slurry will polish the first base wafer at a rate of at least 16,000 angstroms per minute at 6 psi or less of down-force. High base wafer removal rates are essential to the utility of the invention, as a large amount of base layer material is typically removed.

Following CMP processing as described above to thin and planarize the back side of the first base wafer, the carrier will then usually be removed and the resulting thinner base wafer will be used in exposing a through-base wafer via for assembling stacked integrated circuit chips. After the planarization and thinning of the present invention is performed on the base wafer, the wafer is cut or diced to segregate each of the separate integrated circuit chips, replicated many times on the surface of the base wafer. Each integrated circuit chip will contain vias that allow the discrete integrated circuit chips to be interconnected with other similar integrated circuit chips or chips, having electrical circuitry from an entirely different base wafer and wafer processing. This forms a 3-D stack of two or more integrated circuit chips fabricated from one or more base wafers.

The present invention is further demonstrated by the examples below.

EXAMPLES

Symbols and Definitions
1. CMP is chemical mechanical planarization=chemical mechanical polishing
2. Å is angstrom(s), a unit of length
3. Å/min is a polishing rate in angstroms per minute
4. psi is pounds per square inch
5. BP is back pressure in psi
6. PS is the platen rotation speed of the polishing tool in, rpm (revolution(s) per minute)
7. SF is the slurry flow in ml/min
8. CS is carrier speed
9. DF is down force in psi
10. min is minute(s)
11. ml is milliliter(s)
12. mV is millivolt(s)
13. NA means data not available
14. Rpm is revolutions per minute
15. Wt. % is weight percentage All concentrations of components are wt. % unless otherwise indicated. All polishing experiments described in the examples were run with 6 psi of down force (DF) of the polisher.

All experiments described below were run using the equipment and materials as listed below.
CMP Tool: IPEC 472 made by Speedfam IPEC (This company is now owned by Novellus), a two platen system, only used platen 1 with the pad listed below.
Pad: Suba 600 from Nita Haas
  Pad Break-in was a one hour platen warm-up (to temperature) with test slurry and Si filler wafers.
Wafers: Electroplated Cu wafers from SVTC in Austin Tex.
  Cu Wafer Film Stack: 80,000 Å Cu on 250 Å Tantalum on 5000 Å TEOS (tetraethyl orthosilicate) on a silicon Substrate.
  Bare Silicon Wafers from Silicon Valley Microelectronics Si wafers each had 725 microns+ or −15 microns thickness.

Example 1 (Comparative)

A CMP slurry was made up as a control using Mazin™ SR300 colloidal silica slurry (DuPont Air Products NanoMaterials L.L.C., Tempe, Ariz.) diluted 10:1 with deionized water. This slurry had a pH of 10.6. It was used in polishing experiments with Si and Cu blanket wafers that afforded a silicon removal rate of 9644 Å/min and a copper removal rate of 259 Å/min. While the silicon removal rate was relatively high, the copper removal rate was very low without any oxidizer present.

Example 2 (Comparative)

Hydrogen peroxide was added to the slurry as described in Example 1, such that the level of hydrogen peroxide was 1 weight percent in the resulting slurry. This latter slurry with oxidizer was used in polishing experiments with Si and Cu blanket wafers that afforded a silicon removal rate of 1468 Å/min and a copper removal rate of 270 Å/min. The addition of hydrogen peroxide at a 1 weight percent level resulted in the silicon removal rate being dramatically reduced, while the copper removal rate remained approximately the same.

Example 3 (Comparative)

Glycine was added to the slurry as described in Example 1, and then hydrogen peroxide was added, such that the level of hydrogen peroxide in the resulting slurry was 1 weight percent and the level of glycine in the resulting slurry was 0.4 weight percent. The pH in the SR300/glycine mixture, prior to addition of hydrogen peroxide, was 9.85. This resulting slurry, containing the SR300 product, hydrogen peroxide, and glycine, was used in polishing experiments with Si and Cu blanket wafers, that afforded a silicon removal rate of 2259 Å/min and a copper removal rate of 3653 Å/min. While addition of glycine resulted in a substantial increase in the copper removal rate, the silicon removal rate was still quite low due to the presence of hydrogen peroxide at a 1 weight percent level, which level (1 wt. %) is typical for use in copper CMP.

Examples 4-8 (Comparative)

These examples were run in the same manner as for Examples 1-3. As is shown in Table 3, the CMP slurries tested were as described next. The CMP slurry for Example 4 was the same 10:1 SR300 control slurry as in Example 1. The slurries for Examples 5-8 each contained 10:1 SR300 and 0.4 weight percent glycine, and the hydrogen peroxide level varied from 1 wt. % to 3 wt. % to 5 wt. % to 7 wt. % for Examples 5, 6, 7, and 8, respectively. As is shown in Table 3, increasing the level of hydrogen peroxide above 1 weight percent did not result in significantly higher copper removal rate, but did result in a decreasing silicon removal rate.

TABLE 1

| Slurry | Example | Si RR (Å/min) | Cu RR (Å/min) |
| --- | --- | --- | --- |
| 10:1 SR300 | 4 | 9884 | 697 |
| 10:1 SR300 + 0.4 wt. % Glycine + 1 wt. % $H_2O_2$ | 5 | 2159 | 3825 |
| 10:1 SR300 + 0.4 wt. % Glycine + 3 wt. % $H_2O_2$ | 6 | 1319 | 4310 |
| 10:1 SR300 + 0.4 wt. % Glycine + 5 wt. % $H_2O_2$ | 7 | 1316 | 3788 |
| 10:1 SR300 + 0.4 wt. % Glycine + 7 wt. % $H_2O_2$ | 8 | 1274 | 3663 |

Examples 9-10

These examples illustrate that compositions similar to those in Examples 5-8, but having lower levels of hydrogen peroxide surprisingly afford high removal rates for both silicon and copper. In Example 9, the hydrogen peroxide level is 0.25 weight percent and, in Example 10, the hydrogen peroxide level is 0.5 weight percent. See Table 2.

TABLE 2

| Slurry | Example | Si RR (Å/min) | Cu RR (Å/min) |
| --- | --- | --- | --- |
| 10:1 SR300 + 0.4 wt. % Glycine + 0.25 wt. % $H_2O_2$ | 9 | 7499 | 5710 |
| 10:1 SR300 + 0.4 wt. % Glycine + 0.5 wt. % $H_2O_2$ | 10 | 4115 | 5032 |

Examples 11-15

These examples were run for different low levels of hydrogen peroxide, but otherwise in the same manner as for Example 3. As is shown in Table 3, the CMP slurries tested were as described next. The slurries for Examples 11-15 each contained 10:1 SR300 and 0.4 weight percent glycine, and the hydrogen peroxide level varied from 0.25 wt. % to 0.2 wt. % to 0.15 wt. % to 0.1 wt. % to 0.05 wt. % for Examples 11, 12, 13, 14, and 15, respectively. (The pH of the SR300 and glycine slurry prior to hydrogen peroxide addition for these slurries was 9.85.) As is shown in Table 3, decreasing the level of hydrogen peroxide from 0.25 wt. % down to 0.05 wt. % resulted in significantly increased silicon removal rate and relatively high, but declining, copper removal rate with decreasing hydrogen peroxide level.

As the results summarized in Table 3 indicate, slurries containing approximately 0.15 weight percent of hydrogen peroxide affords not only a silicon removal rate approximately the same as the control sample, but also affords a much higher copper removal rate. Furthermore, the Cu:Si selectivity is tunable by adjusting the level of hydrogen peroxide and 1:1 Cu:Si selective slurries are attainable. Use of these slurries with the hydrogen peroxide level below 0.5 weight percent provides for retaining the silicon polishing rate near the rate for polishing of the control sample (Example 1 slurry) while also greatly boosting the copper removal rate.

TABLE 3

| Slurry | Example | Si RR (Å/min) | Cu RR (Å/min) |
| --- | --- | --- | --- |
| 10:1 SR300 + 0.4 wt. % Glycine + 0.25 wt. % $H_2O_2$ | 11 | 7752 | 5587 |
| 10:1 SR300 + 0.4 wt. % Glycine + 0.2 wt. % $H_2O_2$ | 12 | 8276 | 4951 |
| 10:1 SR300 + 0.4 wt. % Glycine + 0.15 wt. % $H_2O_2$ | 13 | 9373 | 4418 |
| 10:1 SR300 + 0.4 wt. % Glycine + 0.1 wt. % $H_2O_2$ | 14 | 11058 | 3847 |
| 10:1 SR300 + 0.4 wt. % Glycine + 0.05 wt. % $H_2O_2$ | 15 | 13019 | 3176 |

Examples 16-18

A base pre-peroxide addition slurry (Base slurry A) was made up using the following components at the levels indicated:

| Component | Weight Percentage |
| --- | --- |
| Deionized water | Balance |
| Potassium hydroxide | 0.653 |
| Tetramethylammonium hydroxide | 0.411 |
| Glycine | 2.000 |
| HT-50 Colloidal Silica | 2.000 |
| HS-40 Colloidal Silica | 2.000 |

The components were added to DI water in the order as listed above to afford this base slurry A, which had a pH of 9.94. Syton® HT-50 and HS-40 colloidal silica slurries are commercially-available products of DuPont Air Products NanoMaterials L.L.C. (Tempe, Ariz.).

Hydrogen peroxide was added to this base slurry at a 0.1 wt. % level in Example 16, at a 0.15 wt. % level in Example 17, and at a 0.2 wt. % level in Example 18, to afford these point-of-use slurries with hydrogen peroxide. These slurries were used in CMP runs to polish Si and Cu blanket wafers to measure the silicon and copper removal rates. Table 4 summarizes the results obtained. As the results in Table 4 indicate, these slurries are tunable 1:1 Cu:Si selective slurries with very high removal rates for both silicon and copper. At these low levels of hydrogen peroxide, the copper removal rate can be tuned by adjusting the oxidizer's concentration slightly, while having only a small effect on the silicon removal rate. When tuned, this slurry is capable of producing an exactly 1:1 Cu:Si selective slurry, if desired.

TABLE 4

| Slurry | Example | Si RR (Å/min) | Cu RR (Å/min) | Cu:Si Sel. |
| --- | --- | --- | --- | --- |
| Base Slurry A + 0.1 wt. % $H_2O_2$ | 16 | 14,392 | 12,771 | 0.89 |
| Base Slurry A + 0.15 wt. % $H_2O_2$ | 17 | 14,067 | 16,664 | 1.18 |
| Base Slurry A + 0.2 wt. % $H_2O_2$ | 18 | 13,435 | 18,337 | 1.36 |

The invention claimed is:

1. A method for preparing a base silicon wafer for constructing an assembly comprising at least two integrated circuit chips at least one of which is from the base silicon wafer, said method comprising:
   a) providing the base silicon wafer having front and back sides, wherein the front side comprises integrated circuits disposed thereon and wherein the base silicon wafer comprises at least one conductive via comprising conductive metal;
   b) affixing the front side of the base silicon wafer having integrated circuits thereon to a carrier;
   c) contacting the back side of the base silicon wafer with a polishing pad and a CMP slurry, said CMP slurry comprising:
      1) a liquid carrier;
      2) hydrogen peroxide at a level of 0.02 weight percent to less than 0.50 weight percent;
      3) an abrasive; and
      4) at least one chelating agent selected from the group consisting of glycine, alanine, asparagine, aspartic acid, cysteine, glutamic acid, glutamine, proline, serine, tyrosine, arginine, histidine ethylenediamine tetraacetic acid, alkane amine: and
   d) polishing the backside of the base silicon wafer until at least one conductive via is exposed or further exposed, wherein silicon on the base silicon wafer is polished using the CMP slurry at a removal rate of at least 5,000 angstroms per minute at 6 psi or less of down-force; and ratio of removal rates of the silicon and the conductive metal ranging from 2:1 to 0.5:1.

2. The method of claim 1 wherein the conductive metal is selected from the group consisting of copper and tungsten.

3. The method of claim 2 wherein the conductive metal is copper.

4. The method of claim 3 wherein the copper:silicon selectivity ranges from 1.5:1 to 0.67:1.

5. The method of claim 3 wherein the copper:silicon selectivity ranges from 1.2:1 to 0.8:1.

6. The method of claim 1 wherein the liquid carrier comprises water.

7. The method of claim 1 wherein the backside of the base silicon wafer is not subjected to a grinding step before chemically mechanically polishing the backside of the base silicon wafer.

8. The method of claim 1 wherein the backside of the base silicon wafer is subjected to a grinding step before chemically mechanically polishing the backside of the base silicon wafer.

9. The method of claim 1 wherein the hydrogen peroxide level is in the range of 0.1 to 0.25 weight percent.

10. The method of claim 1 wherein the hydrogen peroxide level is in the range of 0.15 to 0.2 weight percent.

11. The method of claim 1, wherein the at least one metal chelating agent is glycine.

12. A method for preparing a base silicon wafer for constructing an assembly comprising at least two integrated circuit chips at least one of which is from the base silicon wafer, said method comprising:
   a) providing the base silicon wafer having front and back sides, wherein the front side comprises integrated circuits disposed thereon and wherein the base wafer comprises at least one conductive via comprising conductive metal;
   b) affixing the front side of the base silicon wafer having integrated circuits thereon to a carrier;
   c) contacting the back side of the base silicon wafer with a polishing pad and a CMP slurry, said CMP slurry comprising:
      1) a liquid carrier;
      2) hydrogen peroxide at a level of 0.02 weight percent to less than 0.50 weight percent;
      3) an abrasive which may be suspended in the slurry, which may be affixed to a polishing pad, or both; and
      4) at least one metal chelating agent selected from the group consisting of glycine, alanine, asparagine, aspartic acid, cysteine, glutamic acid, glutamine, proline, serine, tyrosine, arginine, histidine ethylenediamine tetraacetic acid, alkane amine; and
   d) polishing the backside of the base silicon wafer until at least one conductive via is exposed or further exposed, wherein the base silicon wafer is polished using the CMP slurry at a rate of at least 5,000 angstroms per minute at 6 psi or less of down-force ; and ratio of removal rates of the silicon and the conductive metal ranging from 2:1 to 0.5:1.

13. The method of claim 12, wherein the at least one metal chelating agent is glycine.

* * * * *